(12) United States Patent
Young et al.

(10) Patent No.: US 11,327,218 B2
(45) Date of Patent: May 10, 2022

(54) METHOD OF DIRECT ETCHING FABRICATION OF WAVEGUIDE COMBINERS

(71) Applicant: Applied Materials, Inc., Santa Clara, CA (US)

(72) Inventors: Michael Yu-tak Young, Cupertino, CA (US); Wayne McMillan, San Jose, CA (US); Rutger Meyer Timmerman Thijssen, Sunnyvale, CA (US); Robert Jan Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 158 days.

(21) Appl. No.: 16/762,869

(22) PCT Filed: Nov. 13, 2018

(86) PCT No.: PCT/US2018/060651
§ 371 (c)(1),
(2) Date: May 8, 2020

(87) PCT Pub. No.: WO2019/108379
PCT Pub. Date: Jun. 6, 2019

(65) Prior Publication Data
US 2020/0301062 A1  Sep. 24, 2020

Related U.S. Application Data

(60) Provisional application No. 62/592,364, filed on Nov. 29, 2017.

(51) Int. Cl.
*G03F 7/00* (2006.01)
*B44C 1/22* (2006.01)
*F21V 8/00* (2006.01)

(52) U.S. Cl.
CPC ......... *G02B 6/0065* (2013.01); *G02B 6/0038* (2013.01); *G03F 7/0002* (2013.01); *G03F 7/0005* (2013.01)

(58) Field of Classification Search
None
See application file for complete search history.

(56) References Cited

U.S. PATENT DOCUMENTS

| 5,114,513 A | 5/1992 | Hosokawa et al. |
| 5,116,461 A | 5/1992 | Lebby et al. |

(Continued)

FOREIGN PATENT DOCUMENTS

| CN | 103091747 A | 5/2013 |
| CN | 103304129 A | 9/2013 |

(Continued)

OTHER PUBLICATIONS

International Search Report and Written Opinion dated Mar. 5, 2019 for International Application No. PCT/US2018/060651.

(Continued)

*Primary Examiner* — Shamim Ahmed
(74) *Attorney, Agent, or Firm* — Patterson + Sheridan, LLP

(57) ABSTRACT

Embodiments described herein relate to methods for fabricating waveguide structures utilizing substrates. The waveguide structures are formed having input coupling regions, waveguide regions, and output coupling regions formed from substrates. The regions are formed by imprinting stamps into resists disposed on hard masks formed on surfaces of the substrates to form positive waveguide patterns. Portions of the positive waveguide patterns and the hard masks formed under the portions are removed. The substrates are masked and etched to form gratings in the input coupling regions and the output coupling regions.

(Continued)

Residual portions of the positive waveguide patterns and the hard masks disposed under the residual portions are removed to form waveguide structures having input coupling regions, waveguide regions, and output coupling regions formed from substrates.

20 Claims, 9 Drawing Sheets

(56) References Cited

U.S. PATENT DOCUMENTS

| | | | |
|---|---|---|---|
| 2006/0197243 | A1 | 9/2006 | Ellenson et al. |
| 2008/0265338 | A1 | 10/2008 | Yu et al. |
| 2011/0037129 | A1 | 2/2011 | Yu et al. |
| 2012/0049285 | A1 | 3/2012 | Hyun et al. |
| 2013/0272652 | A1 | 10/2013 | Yaacobi et al. |
| 2015/0107885 | A1 | 4/2015 | Morrison et al. |
| 2015/0322286 | A1* | 11/2015 | Cabrini ............... C09D 163/00 428/195.1 |
| 2016/0033784 | A1 | 2/2016 | Levola et al. |
| 2016/0231568 | A1 | 8/2016 | Saarikko et al. |
| 2016/0266387 | A1 | 9/2016 | Tekolste et al. |
| 2016/0308020 | A1* | 10/2016 | Sreenivasan ...... H01L 29/66515 |
| 2017/0003504 | A1 | 1/2017 | Vallius et al. |
| 2017/0307886 | A1 | 10/2017 | Stenberg et al. |
| 2017/0363785 | A1* | 12/2017 | Niwa .................... G02B 5/1809 |
| 2018/0052277 | A1* | 2/2018 | Schowengerdt ........ G06F 1/163 |

FOREIGN PATENT DOCUMENTS

| | | |
|---|---|---|
| CN | 103649823 A | 3/2014 |
| CN | 103837919 A | 6/2014 |
| CN | 103943715 A | 7/2014 |
| CN | 102910579 B | 5/2015 |
| CN | 107020854 A | 8/2017 |
| EP | 1519249 A2 | 3/2005 |
| GB | 2500631 A | 10/2013 |
| JP | S627002 A | 1/1987 |
| JP | H03200106 A | 9/1991 |
| JP | H06-053600 A | 2/1994 |
| JP | H06201909 A | 7/1994 |
| JP | H06-291412 A | 10/1994 |
| JP | 2003195274 A | 7/2003 |
| JP | 2004004161 A | 1/2004 |
| JP | 2004145273 A | 5/2004 |
| JP | 2007122017 A | 5/2007 |
| JP | 2008008990 A | 1/2008 |
| JP | 2008107394 A | 5/2008 |
| JP | 2008299084 A | 12/2008 |
| JP | 2009-004630 A | 1/2009 |
| JP | 2009516225 A | 4/2009 |
| JP | 2011202067 A | 10/2011 |
| JP | 2012-009686 A | 1/2012 |
| JP | 2013-197198 A | 9/2013 |
| TW | 508463 B | 11/2002 |
| WO | 2007057500 A1 | 5/2007 |
| WO | 2008148927 A1 | 12/2008 |
| WO | 2016152771 A1 | 9/2016 |
| WO | 2016205249 A1 | 12/2016 |
| WO | 2014132588 A | 2/2017 |

OTHER PUBLICATIONS

Supplementary European Search Report dated Jul. 29, 2021, for EPO Application No. 18883690.2.
Japanese Office Action dated Aug. 3, 2021, for Japanese Patent Application No. 2020-528232.
Chinese Office Action dated Apr. 8, 2021 for Application No. 201880081384.0.
International Search Report and Written Opinion dated Mar. 5, 2019 for Application No. PCT/US2018/060641.
Shunxiang Shi et al., "Physical Optics and Applied Optics Third Edition", Xi'an Electronic Science and Technology, University Press, Jul. 31, 2014, pp. 175-177.
Korean Office Action dated Nov. 14, 2021 for Application No. 10-2020-7018213.
Korean Office Action issued to 10-2020-7017437 dated Jun. 7, 2021.
Japanese Office Action issued to Patent Application No. 2020-527764 dated Jul. 27, 2021.
Korean Office Action dated Nov. 29, 2021 for Application No. 10-2020-7017437.
Chinese Office Action dated Nov. 19, 2021 for Application No. 201880081384.0.
Japanese Office Action dated Mar. 22, 2022 for Application No. 2020-528232.
Japanese Office Action dated Mar. 22, 2022 for Application No. 2020-527764.

* cited by examiner

METHOD OF DIRECT ETCHING FABRICATION OF WAVEGUIDE COMBINERS

BACKGROUND

Field

Embodiments of the present disclosure generally relate to waveguides for augmented, virtual, and mixed reality. More specifically, embodiments described herein provide for methods of waveguide fabrication from substrates.

Description of the Related Art

Virtual reality is generally considered to be a computer generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device to view the surrounding environment, yet also see images of virtual objects that are generated for display and appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

One such challenge is displaying a virtual image overlayed on an ambient environment. Waveguides are used to assist in overlaying images. Generated light is propagated through a waveguide until the light exits the waveguide and is overlayed on the ambient environment. Fabricating waveguides can be challenging as waveguides tend to have non-uniform properties. Accordingly, what is needed in the art are improved augmented waveguides and methods of fabrication.

SUMMARY

In one embodiment, a method for forming a waveguide structure is provided. The method includes imprinting a stamp into a resist to form a positive waveguide pattern. The resist is disposed on a hard mask formed on a surface of a portion of a substrate. The positive waveguide pattern includes a pattern including at least one of a first plurality of grating patterns, a waveguide pattern, and a second plurality of grating patterns. Each of the first plurality of grating patterns and the second plurality of grating patterns have a residual layer and top pattern surfaces. A curing process is performed to cure the positive waveguide pattern. The stamp is released. A first etching process is performed to remove the residual layer and the hard mask disposed under the residual layer and to expose the surface of the substrate. The substrate is masked to expose a first unprotected area of the surface of the substrate. A second etching process is performed for a first predetermined period of time to form a first plurality of gratings with first depths. The substrate is masked to expose a second unprotected area of the surface of the substrate. The second etching process is performed for a second predetermined period of time to form a second plurality of gratings with second depths. The top pattern surfaces, the waveguide pattern, and the hard mask disposed under the top pattern surfaces and the waveguide pattern are removed to form a waveguide structure including at least one of an input coupling region, a waveguide region, and an output coupling region.

In another embodiment, a method for forming a waveguide structure is provided. The method includes imprinting a stamp into a resist to form a positive waveguide pattern. The resist is disposed on a hard mask formed on a surface of a portion of a substrate. The positive waveguide pattern includes a pattern including at least one of a first plurality of grating patterns, a waveguide pattern, and a second plurality of grating patterns. Each of the first plurality of grating patterns and the second plurality of grating patterns have a residual layer, top pattern surfaces, and sidewall pattern surfaces slanted relative to the surface of the substrate. A curing process is performed to cure the positive waveguide pattern. The stamp is released. A first etching process is performed to remove the residual layer and the hard mask disposed under the residual layer and to expose the surface of the substrate. The substrate is masked to expose a first unprotected area of the surface of the substrate. Etching at a predetermined angle for a first predetermined period of time forms a first plurality of angled gratings with first depths. The substrate is masked to expose a second unprotected area of the surface of the substrate. Etching at the predetermined angle for a second predetermined period of time forms a second plurality of angled gratings with second depths; The top pattern surfaces, the waveguide pattern, and the hard mask disposed under the top pattern surfaces and the waveguide pattern are removed to form a waveguide structure including at least one of an input coupling region, a waveguide region, and an output coupling region.

In yet another embodiment, a method for forming a waveguide structure is provided. The method includes imprinting a stamp into a resist to form a positive waveguide pattern, the resist is disposed on a hard mask formed on a surface of a substrate, the positive waveguide pattern includes a pattern including at least one of a first plurality of grating patterns, a waveguide pattern, and a second plurality of grating patterns. Each of the first plurality of grating patterns and the second plurality of grating patterns have a residual layer, top pattern surfaces, and sidewall pattern surfaces slanted by relative to the surface of the substrate. The positive waveguide pattern is cured by electromagnetic radiation curing. The stamp is released. The residual layer is removed by plasma ashing. The hard mask disposed under the residual layer is reactive ion etched to expose the surface of the substrate. The substrate is masked to expose a first unprotected area of the surface of the substrate. Directional reactive ion etching (RIE) at a predetermined angle for a first predetermined period of time forms a first plurality of angled gratings with first depths. The substrate is masked to expose a second unprotected area of the surface of the substrate. Directional RIE at the predetermined angle for a second predetermined period of time forms a second plurality of angled gratings. The substrate is masked to expose a third unprotected area of the surface of the substrate. Directional RIE at the predetermined angle for a third predetermined period of time forms a third plurality of angled gratings with third depths. The top pattern surfaces and the waveguide pattern are removed by plasma ashing. Reactive ion etching the hard mask disposed under the top pattern surfaces and the waveguide pattern forms a waveguide structure including at least one of an input coupling region, a waveguide region, and an output coupling region

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to methods for fabricating waveguide structures from substrates. The waveguide structures are formed having input coupling regions, waveguide regions, and output coupling regions formed from substrates. The regions are formed by imprinting stamps into resists disposed on hard masks formed on surfaces of the substrates to form positive waveguide patterns. Portions of the positive waveguide patterns and hard masks disposed under the portions are removed. The substrates are masked and etched to form gratings in the input coupling regions and the output coupling regions. Residual portions of the positive waveguide pattern and the hard masks disposed under the residual portions are removed to form waveguide structures having input coupling regions, waveguide regions, and output coupling regions formed from substrates. In one embodiment, the substrates include at least one of glass and plastic materials. In another embodiment, the substrates have a refractive index between about 1.5 and about 2.5.

Figure 1:
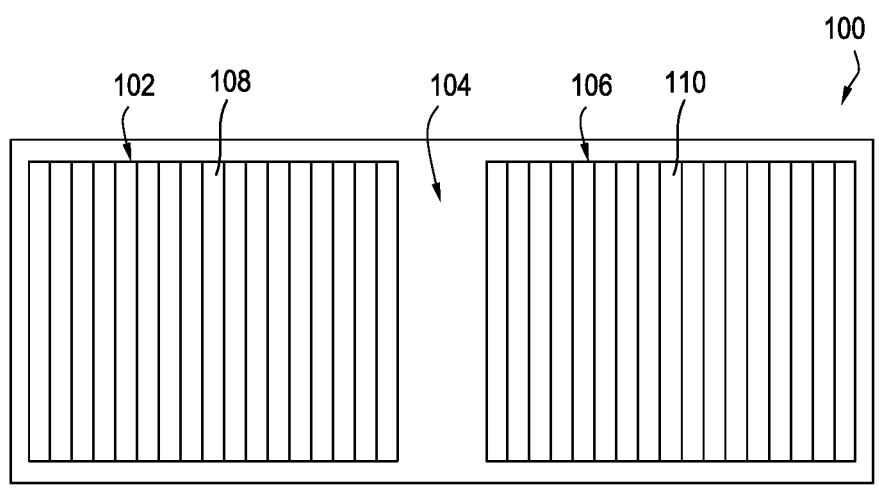
FIG. 1 is a perspective, frontal view of a waveguide combiner according to an embodiment.

FIG. 1 is a perspective, frontal view of a waveguide combiner 100. It is to be understood that the waveguide combiner 100 described below is an exemplary waveguide combiner. The waveguide combiner 100 includes an input coupling region 102 defined by a plurality of gratings 108, a waveguide region 104, and an output coupling region 106 defined by a plurality of gratings 110.

The input coupling region 102 receives incident beams of light (a virtual image) having an intensity from a microdisplay. Each grating of the plurality of gratings 108 splits the incident beams into a plurality of modes, each beam having a mode. Zero-order mode (T0) beams are refracted back or lost in the waveguide combiner 100, positive first-order mode (T1) beams undergo total-internal-reflection (TIR) through the waveguide combiner 100 across the though the waveguide region 104 to the output coupling region 106, and negative first-order mode (T−1) beams propagate in the waveguide combiner 100 a direction opposite to the T1 beams. The T1 beams undergo total-internal-reflection (TIR) through the waveguide combiner 100 until the T1 beams come in contact with the plurality of gratings 110 in the output coupling region 106. The T1 beams contact a grating of the plurality of gratings 110 where the T1 beams are split into T0 beams refracted back or lost in the waveguide combiner 100, T1 beams that undergo TIR in the output coupling region 106 until the T1 beams contact another grating of the plurality of gratings 110, and T−1 beams coupled out of the waveguide combiner 100.

Figure 2:
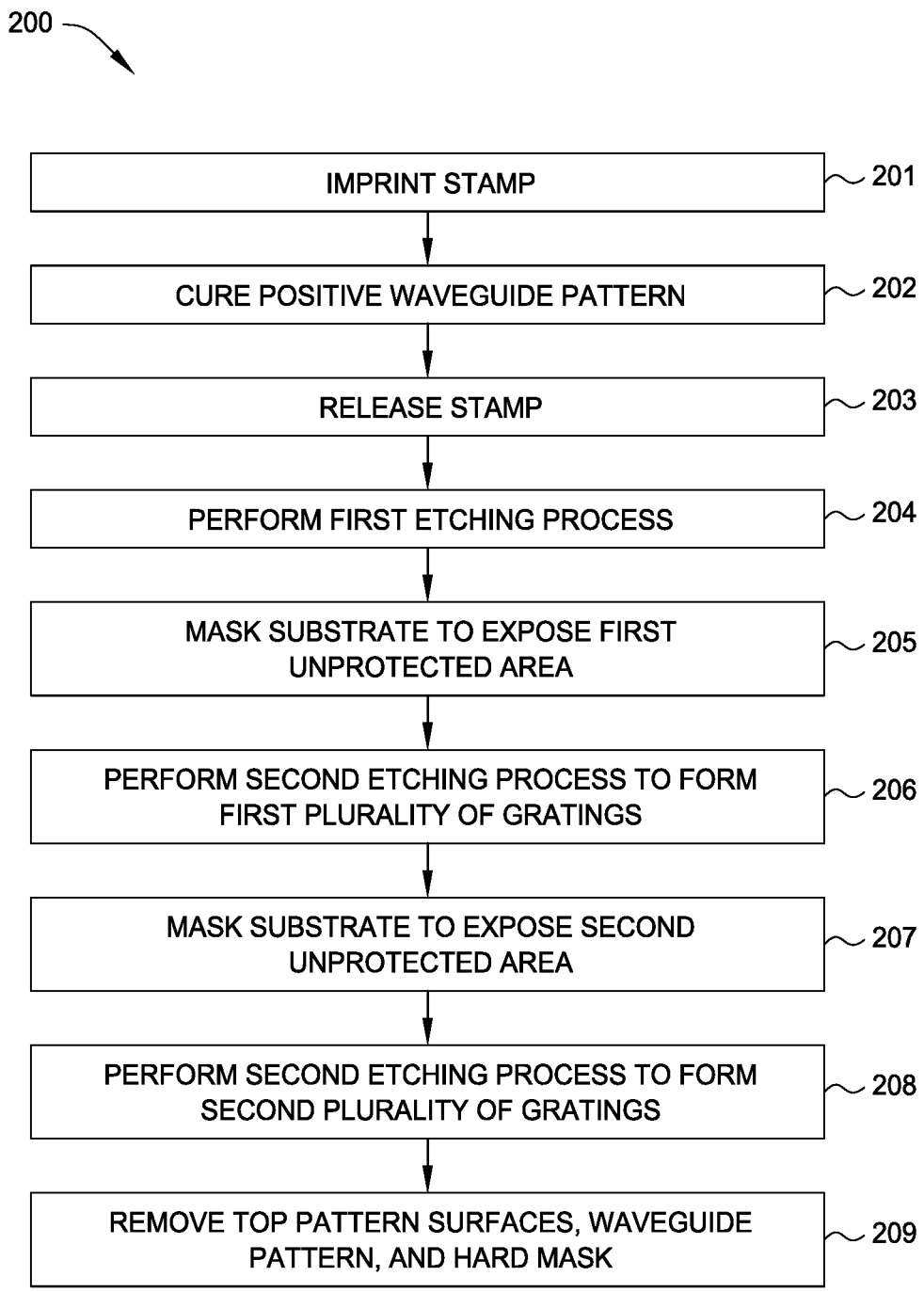
FIG. 2 is a flow chart illustrating operations of a method for forming a waveguide structure according to an embodiment.

FIG. 2 is a flow diagram illustrating operations of a method 200 for forming a waveguide structure. In one embodiment, waveguide structure 300 corresponds to at least one of the input coupling region 102, the waveguide region 104, and the output coupling region 106 of the waveguide combiner 100. At operation 201, a stamp having a negative waveguide pattern is imprinted into a resist that is disposed on a hard mask formed on a surface of a portion of a substrate to form a positive waveguide pattern. The positive waveguide pattern includes a pattern. The pattern includes at least one of an input coupling portion, a waveguide portion, and an output coupling portion to result in the formation of at least one of the input coupling region 102, the waveguide region 104, and the output coupling region 106 of the waveguide combiner 100. The pattern includes a plurality of gratings patterns including a residual layer and top pattern surfaces. In one embodiment, the pattern includes plurality of gratings patterns and a waveguide pattern.

At operation 202, a curing process is performed to cure the positive waveguide pattern. At operation 203, the stamp is released from the resist. At operation 204, the residual layer and the hard mask disposed under the residual layer are removed by performing a first etching process to expose the surface of the portion of the substrate. At operation 205, the substrate is masked to expose a first unprotected area of the surface of the substrate. At operation 206, a first plurality of gratings with first depths is formed by performing a second etching process for a first predetermined period of time. In one embodiment, the first plurality of gratings are a first portion of at least one of the plurality of gratings 108 of the input coupling region 102 and the plurality of gratings 110 of the output coupling region 106. In another embodiment, the first plurality of gratings are at least one of the plurality of gratings 108 of the input coupling region 102 and the plurality of gratings 110 of the output coupling region 106.

At operation 207, the substrate is masked to expose a second unprotected area of the surface of the substrate. At operation 208, a second plurality of gratings with second depths is formed by performing the second etching process for a second predetermined period of time. In one embodiment, the second plurality of gratings are a second portion of at least one of the plurality of gratings 108 of the input coupling region 102 and the plurality of gratings 110 of the output coupling region 106. In another embodiment, the second plurality of gratings are at least one of the plurality of gratings 108 of the input coupling region 102 and the plurality of gratings 110 of the output coupling region 106. At operation 209, the top pattern surfaces, the waveguide pattern, and the hard mask disposed under the top pattern surfaces and the waveguide pattern are removed to form a waveguide structure. The waveguide structure includes at least one of the input coupling region 102, the waveguide region 104, and the output coupling region 106 of the waveguide combiner 100.

Referring to FIGS. 3A-3E, imprinting the stamp, performing a curing process, releasing the stamp, performing the first etching process, performing the second etching process, and removing the top pattern surfaces, the waveguide pattern, and the hard mask will be described in more detail in regards to fabricating a waveguide structure 300.

Figure 3A:
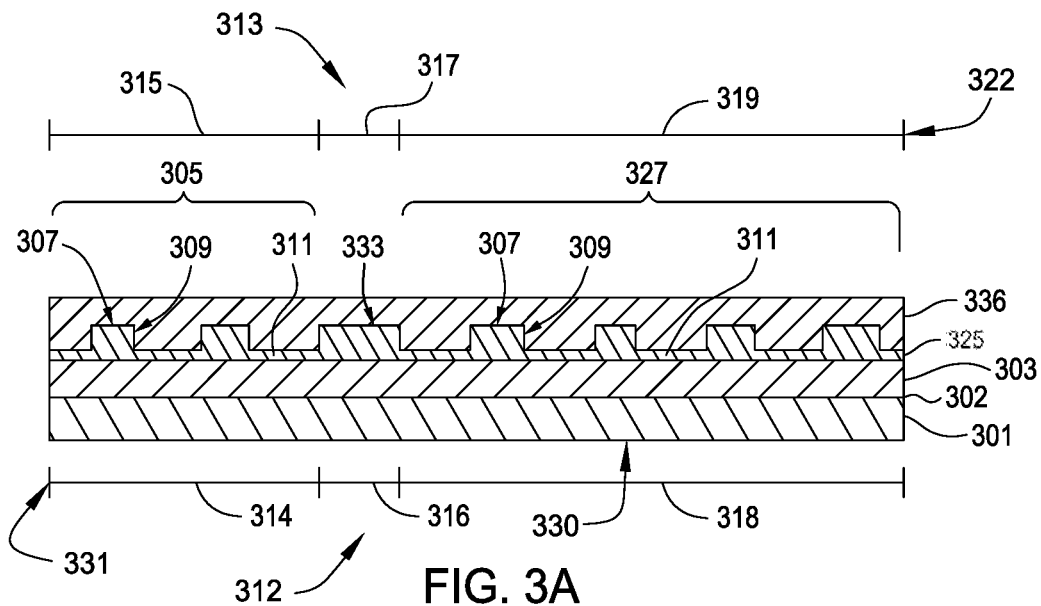
FIGS. 3A-3E are schematic, cross-sectional views of a waveguide during fabrication according to an embodiment.

As shown in FIG. 3A, a stamp 326 is imprinted into a resist 325 disposed on a hard mask 303 formed on a surface 302 of a portion 330 substrate 301 to form a positive waveguide pattern 313. The stamp 326 has a negative waveguide pattern 312 that includes an inverse pattern 331. The inverse pattern 331 includes at least one of an input coupling portion 314, an inverse waveguide portion 316, and an inverse output coupling portion 318. The stamp 326 is fabricated from a waveguide master having a master pattern. In one embodiment, the master pattern includes at least one of a master input coupling portion, a master waveguide portion, and a master output coupling portion. The stamp 326 is molded from the waveguide master.

The stamp 326 may include a semi-transparent material such as fused silica or polydimethylsiloxane (PDMS) to allow the positive waveguide pattern 313 to be cured by exposure to radiation, such as infrared (IR) radiation or ultraviolet (UV) radiation at operation 202. In one embodiment, the resist 325 comprises a UV curable material (such as mr-N210 available from Micro Resist Technology) that is nano imprintable by the stamp 326 including PDMS. The positive waveguide pattern 313 may alternatively be thermally cured at operation 202. In one embodiment, the surface 302 of the substrate 301 is prepared for spin coating of the UV curable material by UV ozone treatment, oxygen ($O_2$) plasma treatment, or by application of a primer (such as mr-APS1 available from Micro Resist Technology). In another embodiment, the resist 325 includes a thermally curable material that may be cured by a solvent evaporation curing process. The solvent evaporation curing process may include thermal heating or infrared illumination heating. The resist 325 may be disposed on the surface 302 using a liquid material pour casting process, a spin-on coating process, a liquid spray coating process, a dry powder coating process, a screen printing process, a doctor blading process, a physical vapor deposition (PVD) process, a chemical vapor deposition (CVD) process, a flowable CVD (FCVD) process, or an atomic layer deposition (ALD) process.

The positive waveguide pattern 313 includes a pattern 322. The pattern 322 includes at least one of an input coupling portion 315, a waveguide portion 317, and an output coupling portion 319. The pattern 322 includes at least one of a first plurality of grating patterns 305, a waveguide pattern 333, and a second plurality of grating patterns 327. Each of the first plurality of grating patterns 305 and the second plurality of grating patterns 327 has a residual layer 311, oftentimes referred to as bottom pattern surfaces, and top pattern surfaces 307 parallel to the surface 302 of the substrate 301 and sidewall pattern surfaces 309 oriented normal to the surface 302 of the substrate 301.

Figure 3B:
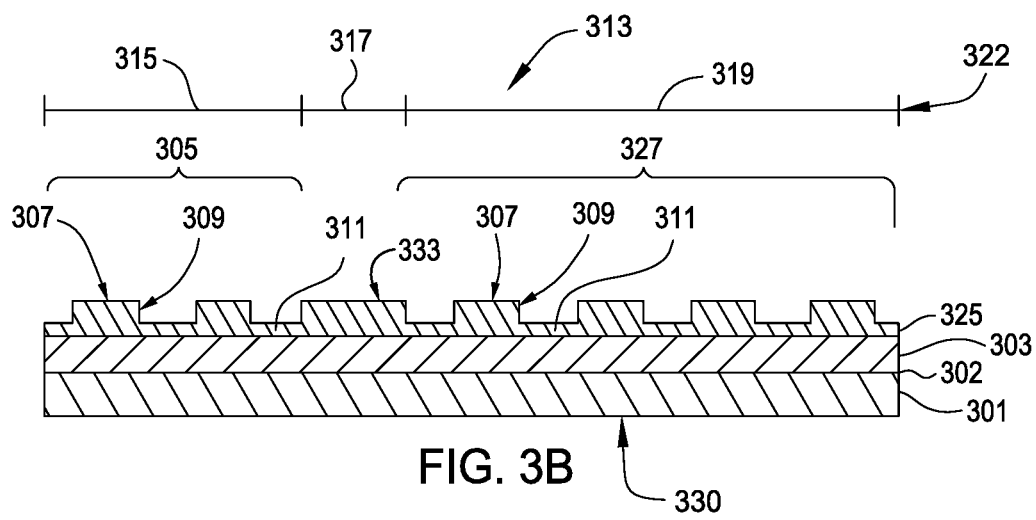

FIG. 3B illustrates a schematic, cross-sectional view after the stamp 323 has been released at operation 203. In one embodiment, the stamp 326 can be mechanically removed by a machine tool or by hand peeling as the stamp 326 may be coated with a mono-layer of anti-stick surface treatment coating, such as a fluorinated coating. In another embodiment, the stamp 326 may comprise a polyvinyl alcohol (PVA) material that is water soluble in order for the stamp 326 to be removed by dissolving the stamp 326 in water. In yet another embodiment, the stamp 326 comprises a rigid backing sheet, such as a sheet of glass, to add mechanical strength.

Figure 3C:
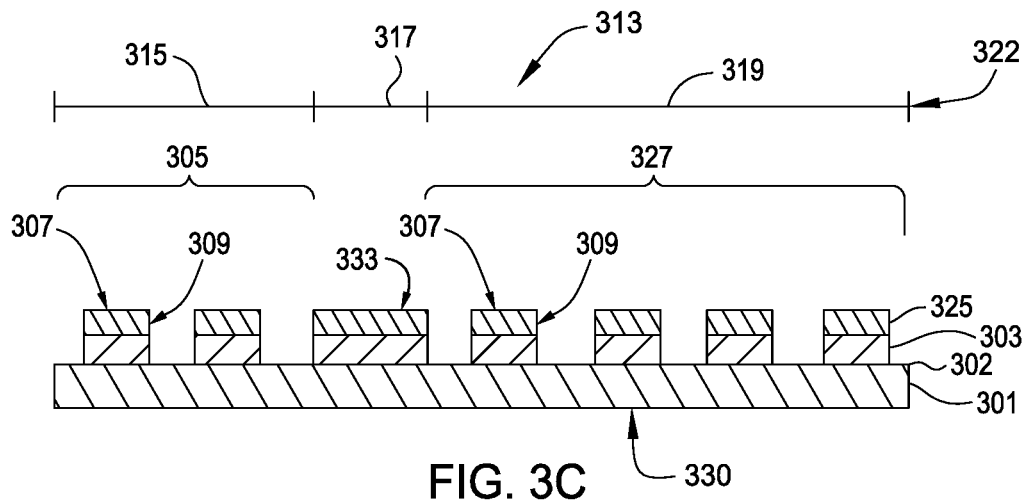

FIG. 3C is a schematic, cross-sectional view after the first etching process removes the residual layer 311 and the hard mask 303 disposed under the residual layer 311 and exposes the surface 302 of the substrate 301 at operation 204. The residual layer 311 may be removed by plasma ashing, oftentimes referred to as plasma descumming, using an oxygen gas ($O_2$) containing plasma, a fluorine gas ($F_2$) containing plasma, a chlorine gas ($Cl_2$) containing plasma, and/or a methane ($CH_4$) containing plasma. In one embodiment, a first radio frequency (RF) power is applied to $O_2$ and an inert gas, such as argon (Ar) or nitrogen (N), until the residual layer 311 is removed. The hard mask 303 disposed under the residual layer 311 may be removed by ion etching, reactive ion etching (RIE), or highly selective wet chemical etching. For example, the hard mask 303 may have a first layer comprising a first material and a second layer comprising a second material, where the second layer is formed on the first layer disposed on the surface 302 of the substrate 301. The second layer may be removed by utilizing a high etch selectivity of the second material over the first material and materials of the substrate 301. The first layer may be removed by utilizing a high etch selectivity of the first material over the materials of the substrate 301. In one embodiment, the hard mask 303 comprises a silicon containing layer (such as OptiStack® HM825-302.6 available from Brewer Science) disposed on a carbon containing layer (such as OptiStack® SOC110D available from Brewer Science). The silicon containing layer disposed under the residual layer 311 is removed by RIE using a $F_2$ containing plasma, and the carbon containing layer disposed under the residual layer 311 is removed by RIE using a $O_2$ containing plasma. In another embodiment, the hard mask 303 comprises a chromium containing layer disposed on a silicon dioxide ($SiO_2$) containing layer. The chromium containing layer disposed under the residual layer 311 is removed by RIE using a $Cl_2$ containing plasma, such as $BCl_3$, and the silicon dioxide containing layer is removed by RIE using a $F_2$ containing plasma or $CH_4$ containing plasma.

Figure 3D:
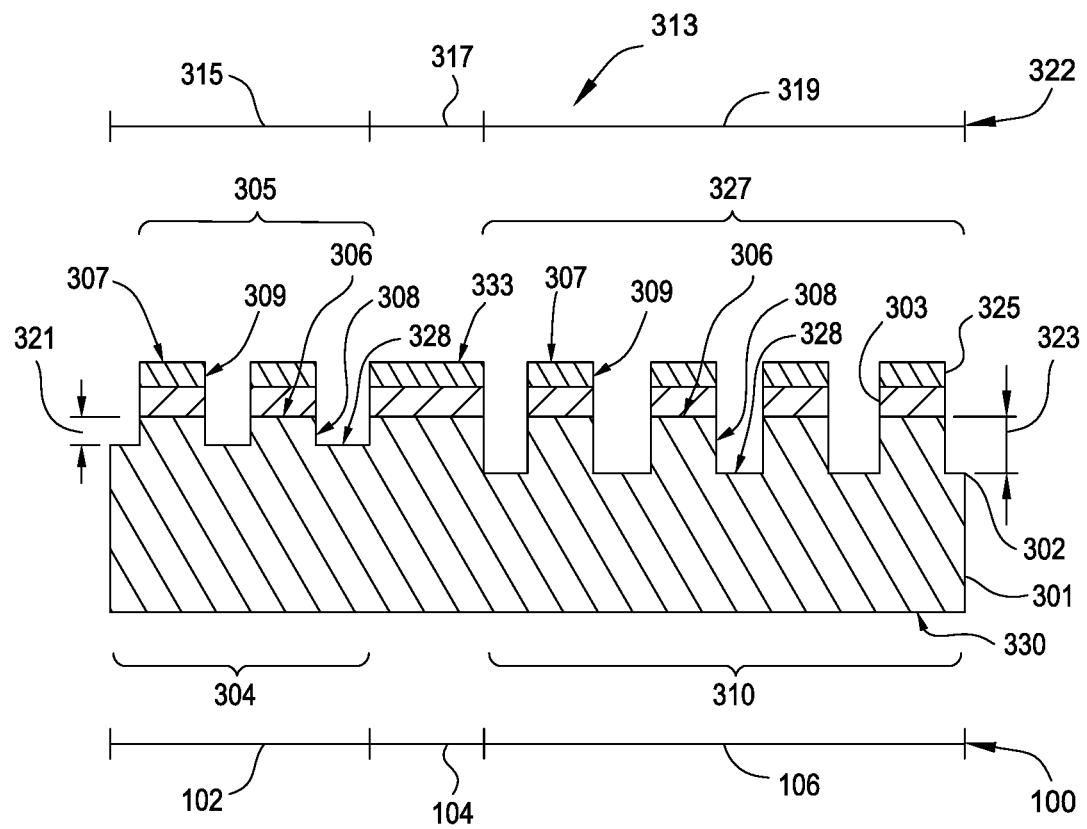

FIG. 3D is a schematic, cross-sectional view after operations 205-208. At operations 205-208, the second etching process is performed for a first predetermined period of time after the substrate 301 is masked to expose the first unprotected area of the surface 302 of the substrate 301 and the second etching process is performed for a second predetermined period of time after the substrate 301 is masked to expose a second unprotected area of the surface 302 of the substrate 301. In one embodiment, a chamber mounted etch end point detection system is used. Masking the substrate 301 may include placing a shadow mask in physical contact with the surface 302 of the substrate 301 or aligning a photomask over the substrate 301 to expose the first unprotected area. In one embodiment, the shadow mask is metal and may be used repeatedly.

In one embodiment, the first unprotected area corresponds to a first region and the second unprotected area corresponds to a second region of the resulting waveguide structure 300. In another embodiment, the first unprotected area corresponds to the first region and the second region, and the second unprotected area corresponds to the second region. In one embodiment, as shown, the first region is the input coupling region 102 and the second region is the output coupling region 106. In another embodiment, not shown, the first region and the second region are regions of the input coupling region 102 or the output coupling region 106. The second etching process may include etching processes such as ion implantation, ion etching, RIE, directional RIE such as directed ribbon-beam ion etching, microblasting, waterjet cutting, and laser etching for the first predetermined period of time to form a first plurality of gratings 304 with first depths 321. One example of an ion implantation apparatus is the Varian VIISTA® Trident, available from Applied Materials, Inc., Santa Clara, Calif. Ion etching may be in the presence of an etch gas to improve the ion etching rate The first plurality of gratings 304 further includes top surfaces 306 and bottom surfaces 328 corresponding to the surface 302 of the substrate 301 and sidewall surfaces 308 oriented normal to the surface 302 of the substrate 301. The shadow mask may be relocated or the photomask may be realigned to expose the second unprotected area. Performing the second etching process for a second predetermined period of time forms the second plurality of gratings 310 with second depths 323. The second plurality of gratings 310 further includes the top surfaces 306, the bottom surfaces 328, and the sidewall surfaces 308.

Figure 3E:
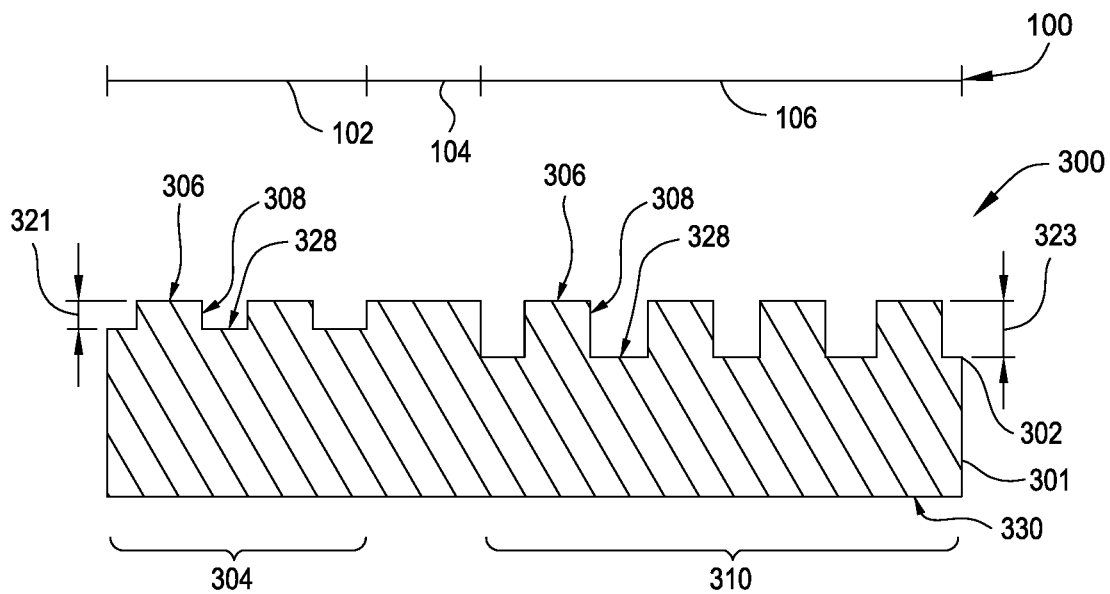

FIG. 3E is a schematic, cross-sectional view of the waveguide structure 300 formed after operation 209. At operation 209, the top pattern surfaces 307, the waveguide pattern 333, and the hard mask 303 disposed under the top pattern surfaces 307 and waveguide pattern 333 at operation 207 are removed to form the waveguide structure 300 including at least one of the input coupling region 102, the waveguide region 104, and the output coupling region 106 of the waveguide combiner 100. The top pattern surfaces 307 and the waveguide pattern 333 may be removed by plasma ashing using the $O_2$ containing plasma, the $F_2$ containing plasma, the $Cl_2$ containing plasma and/or the $CH_4$ containing plasma. In one embodiment, a second radio frequency (RF) power is applied to $O_2$ and an inert gas, such as argon (Ar) or nitrogen (N), until the top pattern surfaces 307 and the waveguide pattern 333 are removed. The hard mask 303 disposed under the top pattern surfaces 307 and waveguide pattern 333 may be removed by ion etching, RIE, or highly selective wet chemical etching. In one embodiment, the hard mask 303 includes the silicon containing layer disposed on the carbon containing layer. The silicon containing layer is removed by RIE using the $F_2$ containing plasma, and the carbon containing layer is removed by RIE using the $O_2$ containing plasma. In another embodiment, the hard mask 303 comprises the chromium containing layer disposed on the $SiO_2$ containing layer. The chromium containing layer is removed by RIE using the $Cl_2$ containing plasma and the silicon dioxide containing layer is removed by RIE using the $F_2$ containing plasma or the $CH_4$ containing plasma. In another embodiment, the hard mask 303 is not removed and the hard mask 303 comprises materials, such as $SiO_2$ and titanium dioxide ($TiO_2$), with controlled refractive indices between about 1.5 and about 2.5.

The waveguide structure 300 resulting from the method 200 has a substantially uniform refractive index. Utilizing materials having a refractive index of between about 1.5 and about 2.5 for the substrate 301, as compared to the refractive index of air (1.0), total internal reflection, or at least a high degree thereof, is achieved to facilitate light propagation through the waveguide structure 300.

Referring to FIGS. 4A-4E, imprinting the stamp, performing a curing process, releasing the stamp, performing the first etching process, performing the second etching process, and removing the top pattern surfaces, the waveguide pattern, and the hard mask will be described in more detail in regards to fabricating a waveguide structure 400.

Figure 4A:
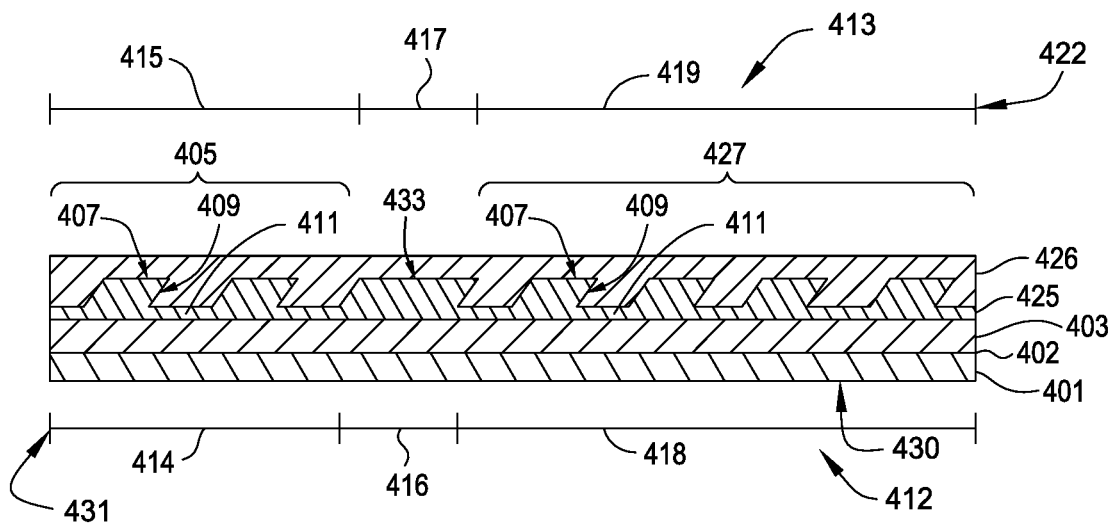
FIGS. 4A-4E are schematic, cross-sectional views of a waveguide during fabrication according to an embodiment.
Figure 4B:
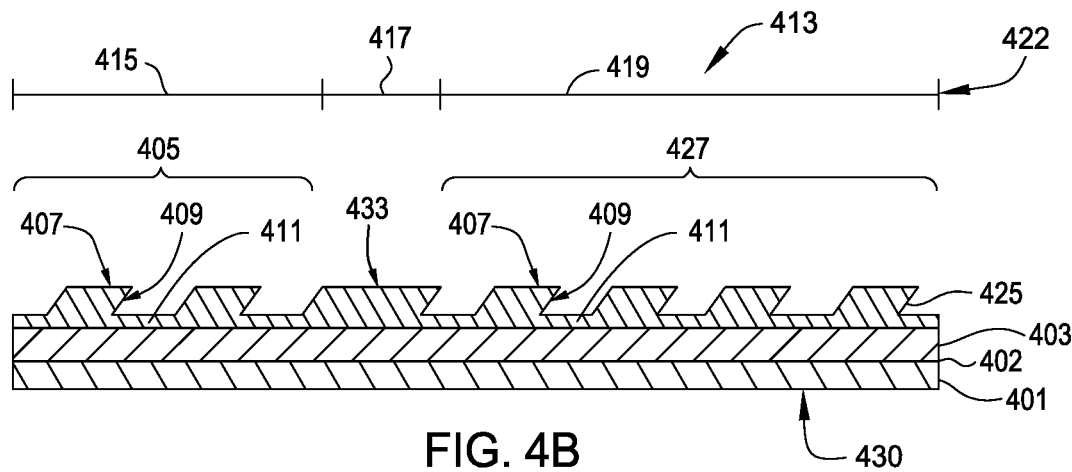
Figure 4C:
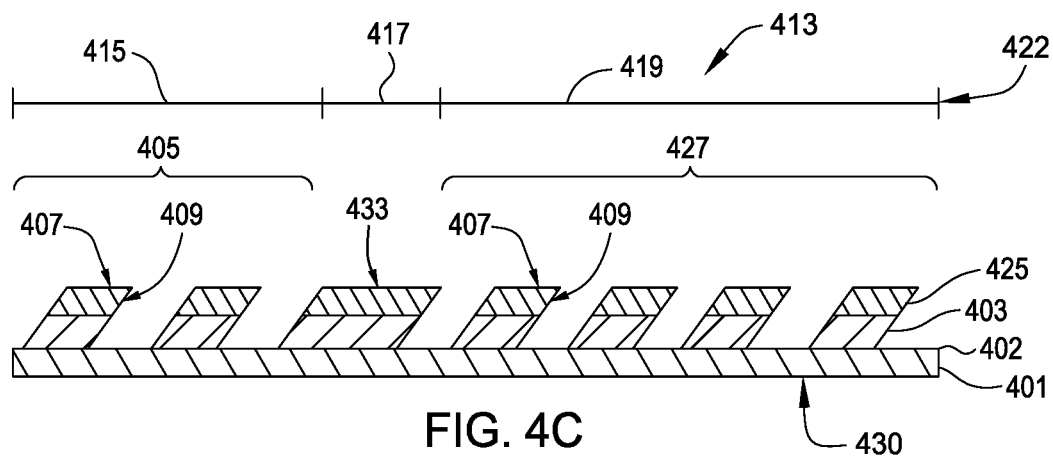
Figure 4D:
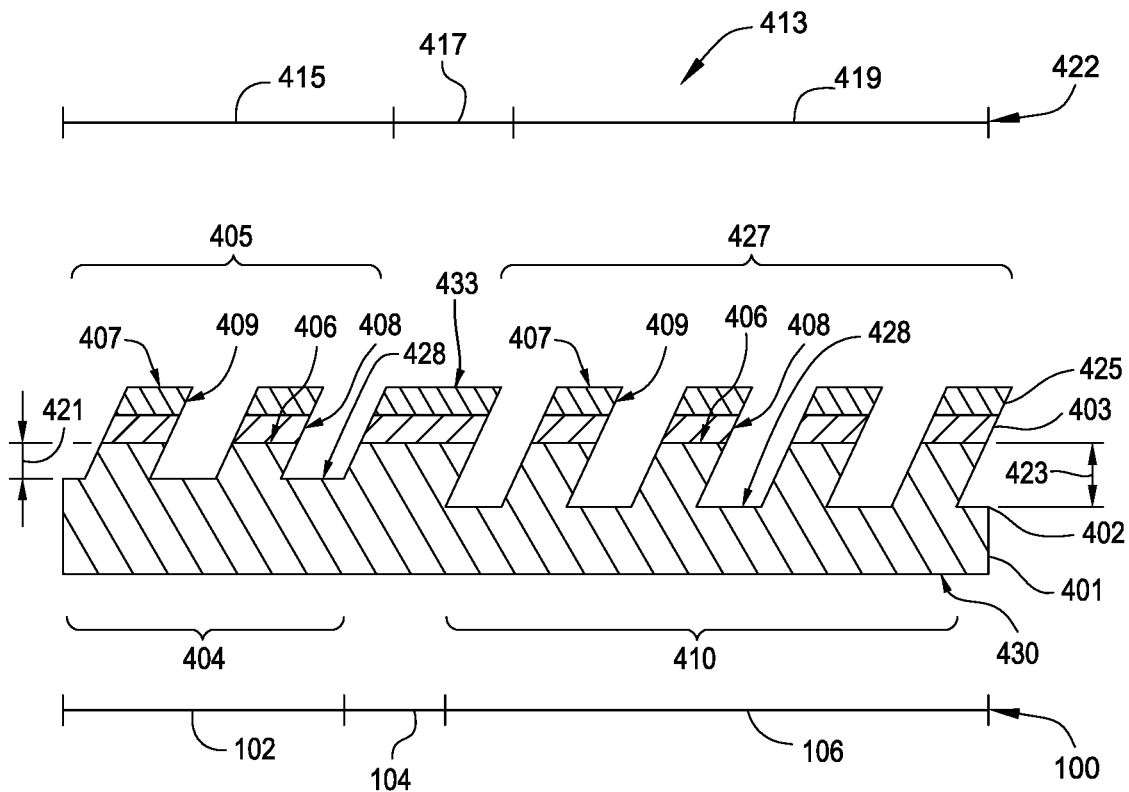
Figure 4E:
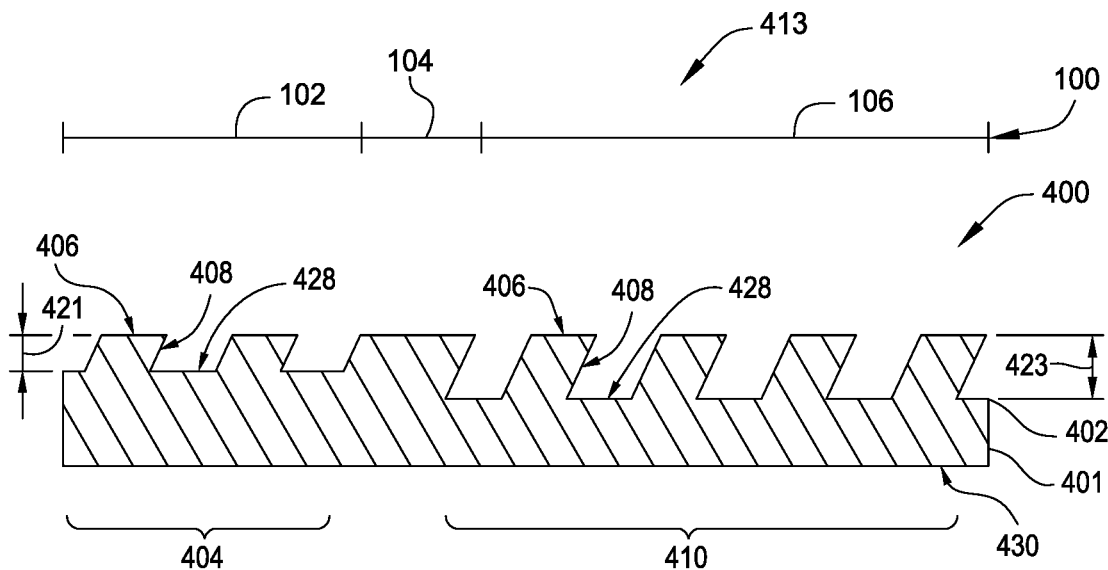

At operation 201, a stamp 426 is imprinted into a resist 425 disposed on a hard mask 403 formed on a surface 402 of a portion 430 of a substrate 401 to form a positive waveguide pattern 413. As shown in FIG. 4A, the stamp 426 has a negative waveguide pattern 412 that includes an inverse pattern 431. The inverse pattern 431 includes at least one of an inverse input coupling portion 414, an inverse waveguide portion 416, and an inverse output coupling portion 418. At operation 202, the positive waveguide pattern 413 is cured.

The positive waveguide pattern 413 includes a pattern 422. The pattern 422 includes at least one of includes an input coupling portion 415, a waveguide portion 417, and an output coupling portion 419. The pattern 422 includes at least one of a first plurality of grating patterns 405, a waveguide pattern 433, and a second plurality of grating patterns 427. Each of the first plurality of grating patterns 405 and the second plurality of grating patterns 427 has a residual layer 411, oftentimes referred to as bottom pattern surfaces, and top pattern surfaces 407 parallel to the surface 402 of the substrate 401 and sidewall pattern surfaces 409 slanted by an amount relative to the surface 402 of the substrate 401.

At operation 203, the stamp 426 is released from the resist 425. At operation 204, the residual layer 411 and the hard mask 403 disposed under the residual layer 411 are removed by performing a first etching process to expose the surface 402 of the substrate 401.

At operation 205, the substrate 401 is masked to expose a first unprotected area of the surface 402 of the substrate 401. Masking the substrate 401 may include placing a shadow mask in physical contact with the surface 402 of the substrate 401 or aligning a photomask over the substrate 401 to expose the first unprotected area. In one embodiment, the first unprotected area corresponds to a first region and the second unprotected area corresponds to a second region of the resulting waveguide structure 400. In another embodiment, the first unprotected area corresponds to the first region and the second region, and the second unprotected area corresponds to the second region. In one embodiment, as shown, the first region is the input coupling region 102 and the second region is the output coupling region 106. In another embodiment, not shown, the first region and the second region are regions of the input coupling region 102 or the output coupling region 106. At operation 206, performing the second etching process at a predetermined angle for a first predetermined period of time of time forms a first plurality of gratings 404 with first depths 421 and sidewall surfaces 408 slanted by an amount relative to the surface 402 of the substrate 401. The predetermined angle may be determined by computer simulation to maximize the light coupling efficiency of the waveguide structure 400 and the predetermined angle may range from about 15 degrees to about 75 degrees. The first plurality of gratings 404 further includes top surfaces 406 parallel to the surface and bottom surfaces 328 corresponding to the surface 302.

Etching at the predetermined angle may include etching processes such as angled ion implantation, angled ion etching, and directional RIE such as directed ribbon-beam ion etching. Angled ion implantation includes accelerating ions towards the surface 402 of the substrate 401 at the predetermined angle relative to the surface 402 of the substrate 401 and bombarding the substrate 401 with ions at the predetermined angle to selectively remove material to form the first plurality of gratings 404. In one embodiment, introduction of an etch gas close to an ion generation source will improve the ion etching rate. One example of an angled ion implantation apparatus is the Varian VIISTA® Trident, available from Applied Materials, Inc., Santa Clara, Calif.

At operation 207, the substrate 401 is masked to expose a second unprotected area of the surface 402 of the substrate 401. The shadow mask may be relocated or the photomask may be realigned to expose the second unprotected area. At operation 208, a second plurality of angled gratings 410 with second depths 423 is formed by etching at the predetermined angle for a second predetermined period of time. The second plurality of angled gratings 410 further includes top surfaces 406 and bottom surfaces 428 and sidewall surfaces 408 slanted by an amount relative to the surface 402 of the substrate 401.

At operation 209, the top pattern surfaces 407, the waveguide pattern 433, and the hard mask 403 disposed under the top pattern surfaces 407 and the waveguide pattern 433 are removed to form the waveguide structure 400 having the input coupling region 102, the waveguide region 104, and the output coupling region 106. The top pattern surfaces 407 and the waveguide pattern 433 may be removed to form the waveguide structure 400 including at least one of the input coupling region 102, the waveguide region 104, and the output coupling region 106 of the waveguide combiner 100. In another embodiment, the hard mask 403 is not removed and the hard mask 403 comprises materials with controlled refractive indices between about 1.5 and about 2.5. The waveguide structure 400 resulting from the method 200 has substantially uniform refractive index.

Figure 5:
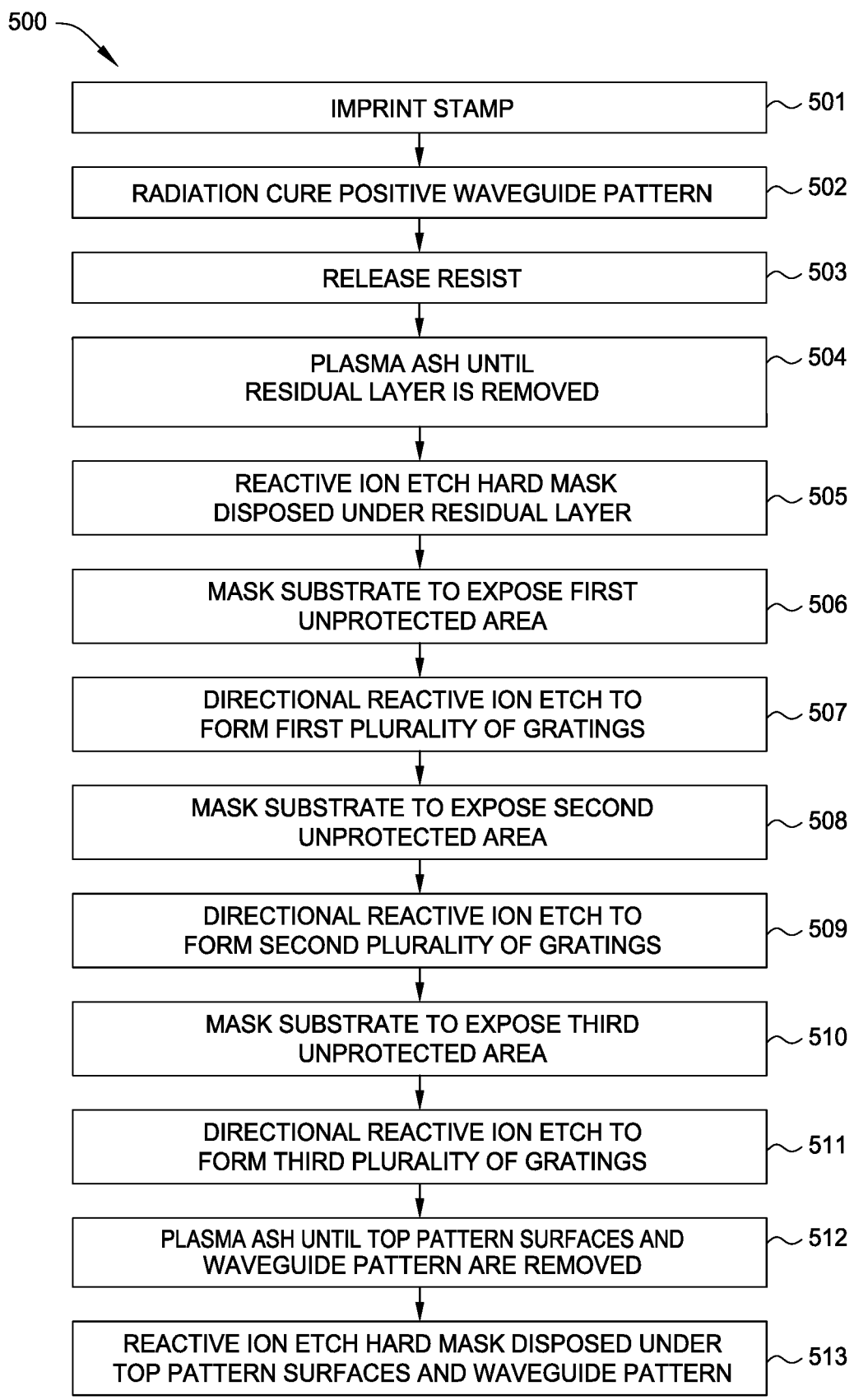
FIG. 5 is a flow chart illustrating operations of a method for forming a waveguide structure according to an embodiment
Figure 6A:
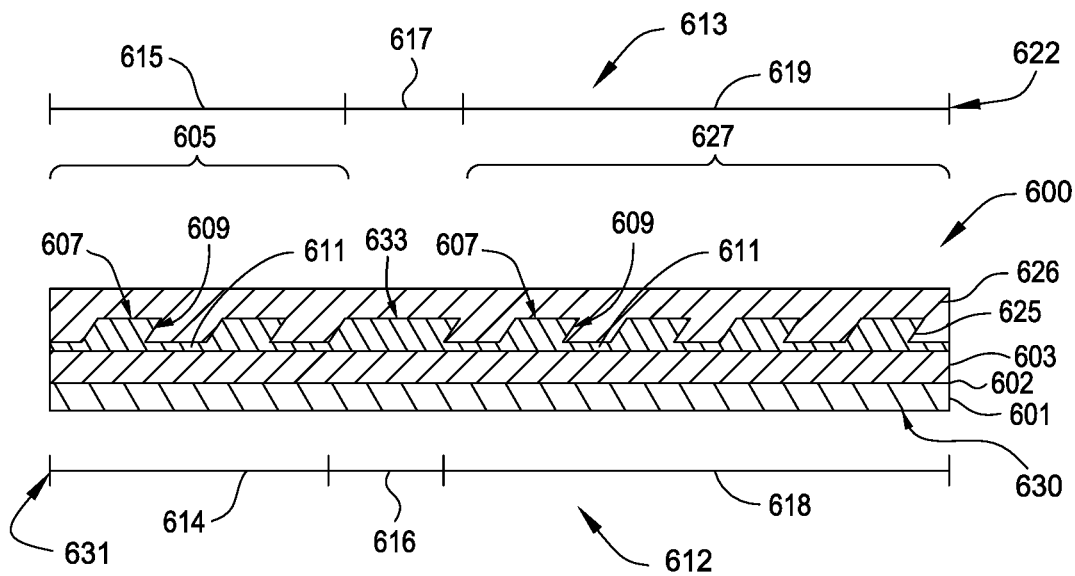
FIGS. 6A-6E are schematic, cross-sectional views of a waveguide during fabrication according to an embodiment.
Figure 6B:
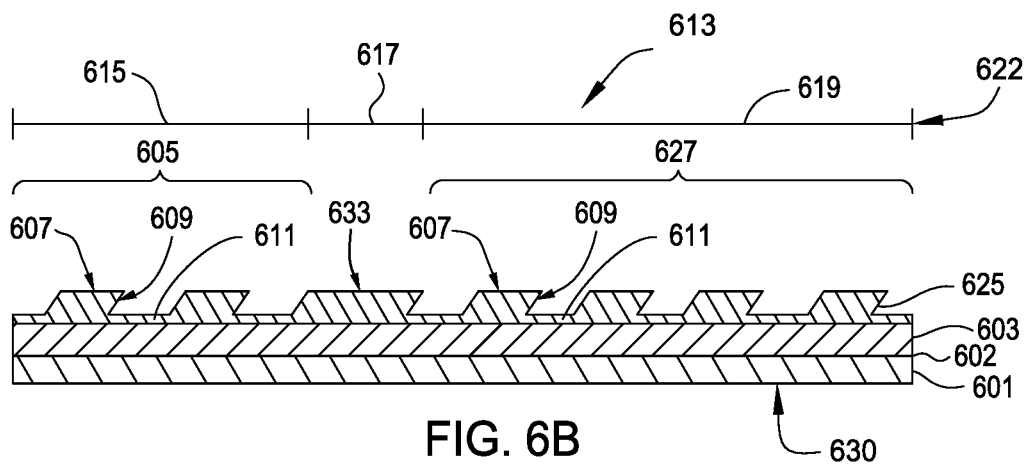
Figure 6C:
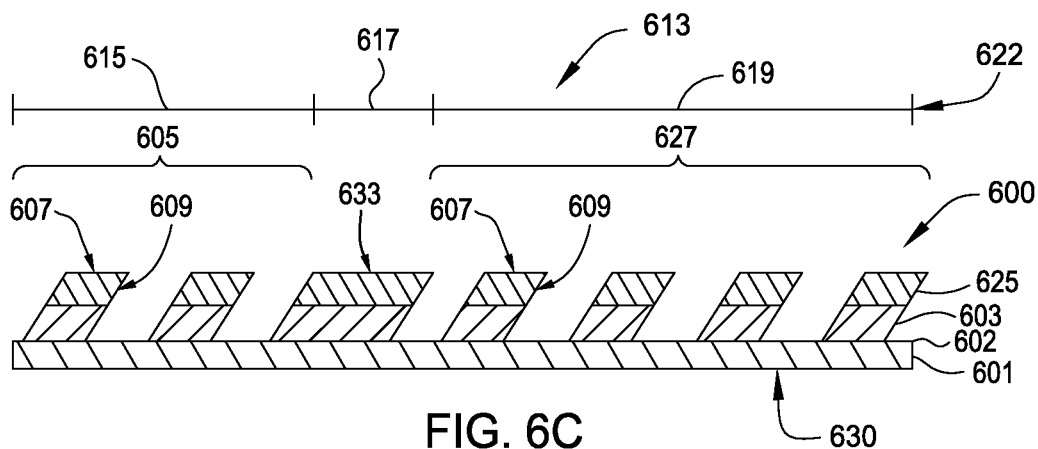
Figure 6D:
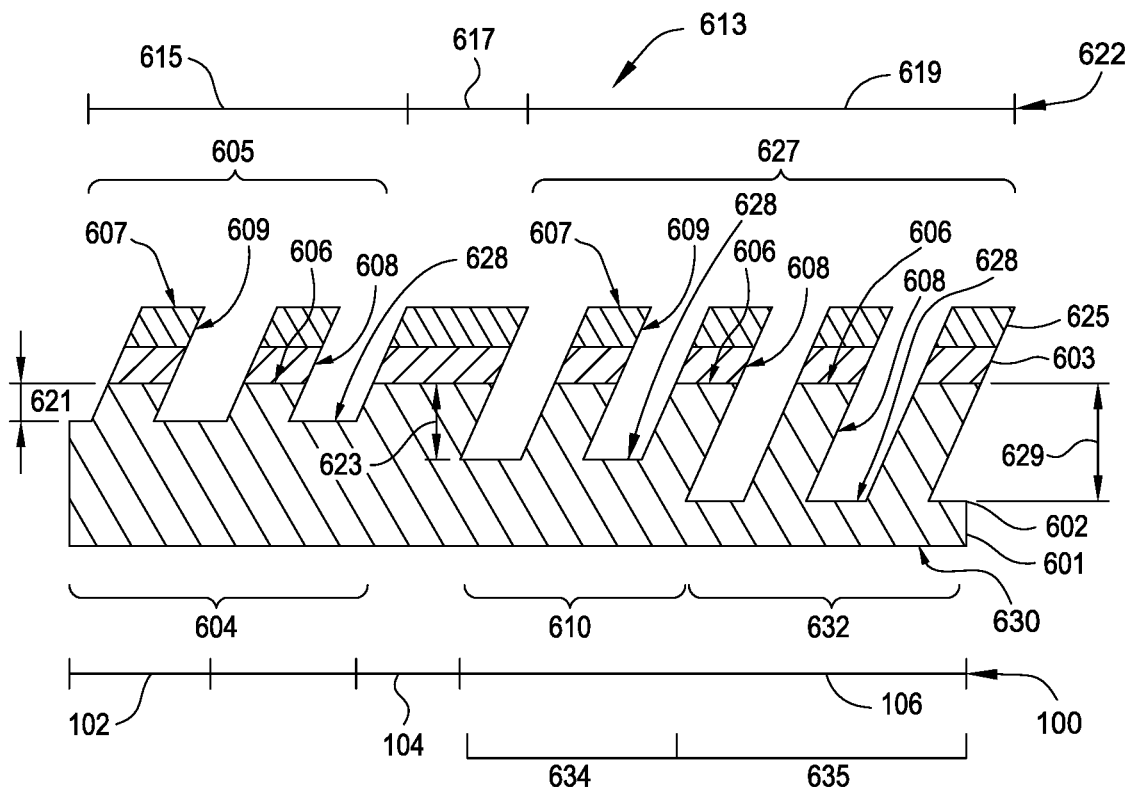
Figure 6E:
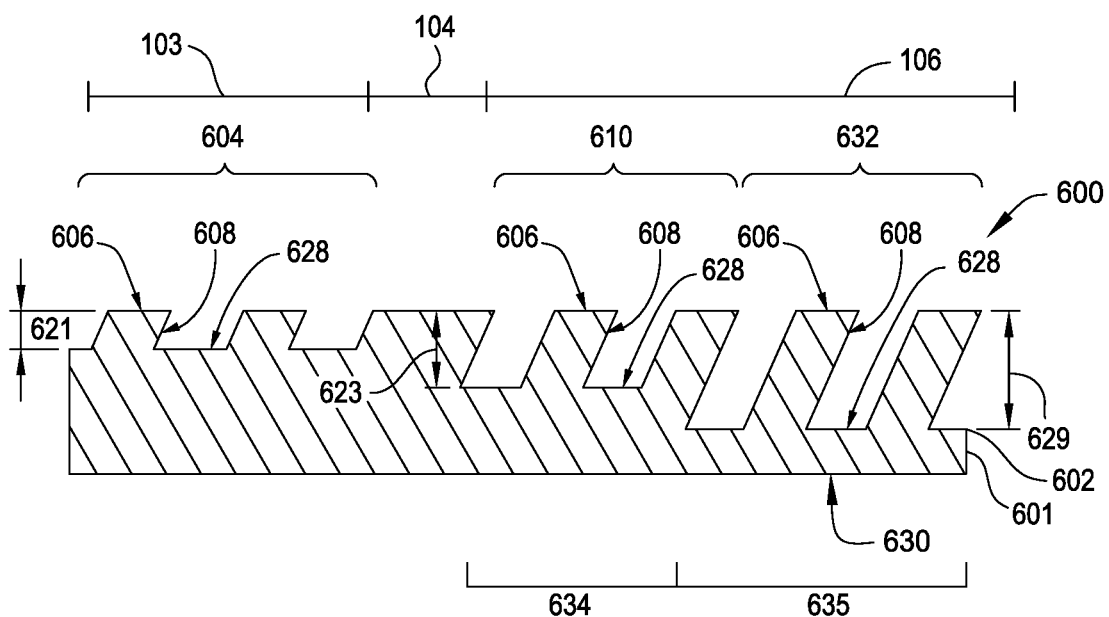

FIG. 5 is a flow diagram illustrating operations of a method 500 for forming a waveguide structure 600 as shown in FIGS. 6A-6E. In one embodiment, waveguide structure 600 corresponds to at least one of the input coupling region 102, the waveguide region 104, and the output coupling region 106 of the waveguide combiner 100. At operation 501, a stamp 626 is imprinted into a resist 625 disposed on a hard mask 603 formed on a surface 602 of a portion 630 of a substrate 601 to form a positive waveguide pattern 613. As shown in FIG. 6A, the stamp 626 has a negative waveguide pattern 612 that an inverse pattern 631. The inverse pattern 631 includes at least one of an inverse input coupling portion 614, an inverse waveguide portion 616, and an inverse output coupling portion 618.

The positive waveguide pattern 613 includes a pattern 622. The pattern 622 includes at least one of an input coupling portion 615, a waveguide portion 617, and an output coupling portion 619. The pattern 622 includes at least one of a first plurality of grating patterns 605, a waveguide pattern 633, and a second plurality of grating patterns 627. Each of the first plurality of grating patterns 605 and the second plurality of grating patterns 627 has a residual layer 611, oftentimes referred to as bottom pattern surfaces, and top pattern surfaces 607 parallel to the surface 602 of the substrate 601 and sidewall pattern surfaces 609 slanted by an amount relative to the surface 602 of the substrate 601.

At operation 502, the positive waveguide pattern 613 is cured by exposure to electromagnetic radiation, such as infrared (IR) radiation and ultraviolet (UV) radiation. At operation 503, the stamp 626 is released from the resist 625. At operation 504, the residual layer 611 is removed by plasma ashing until the residual layer 611 is removed. At operation 505, the hard mask 603 disposed under the residual layer 611 is removed by ion etching, reactive ion etching (RIE), and highly selective wet chemical etching.

At operation 506, the substrate 601 is masked to expose a first unprotected area of the surface 602 of the substrate 601. Masking the substrate 601 may include placing a shadow mask in physical contact with the surface 602 of the substrate 601 or aligning a photomask over the substrate 601 to expose the first unprotected area. In one embodiment, the first unprotected area corresponds to a first region, the second unprotected area corresponds to a second region, and a third unprotected area corresponds to a third region of the resulting waveguide structure 600. In another embodiment, the first unprotected area corresponds to the first region, the second region, and the third region, the second unprotected area corresponds to the second region and the third region, and the third unprotected area corresponds to the third region. In one embodiment, as shown, the first region is the input coupling region 102, and the second region and the third region are the output coupling region 106. In another embodiment, not shown, the first region, the second region, and the third region are regions of the input coupling region 102 or the output coupling region 106.

At operation 507, in one embodiment, a first plurality of gratings 604 with first depths 621 is formed by directional reactive ion etching (RIE) at a predetermined angle for a first predetermined period of time to a first etch depth. The first plurality of gratings 604 further includes top surfaces 606 parallel to the surface 602 of the substrate 601, bottom surfaces 628 corresponding to the surface 602 of the substrate 601, sidewall surfaces 608 slanted by an amount relative to the surface 602 of the substrate 601.

At operation 508, the substrate 601 is masked to expose a second unprotected area of the surface 602 of the substrate 601. The shadow mask may be relocated or the photomask may be realigned to expose the second unprotected area. In one embodiment, the second unprotected area corresponds to a first portion 634 of the output coupling region 106. In another embodiment, the second unprotected are corresponds to the first portion 634 and a second portion 635 of the output coupling region 106. In one embodiment, at operation 509, a second plurality of angled gratings 610 with second depths 623 in the first portion 634 is formed by directional RIE at the predetermined angle for a second predetermined period of time. The second plurality of angled gratings 610 further includes top surfaces 606, bottom surfaces 628, and sidewall surfaces 608 slanted by an amount relative to the surface 602 of the substrate 601.

At operation 510, the substrate 601 is masked to expose a third unprotected area of the surface 602 of the substrate 601. The shadow mask may be relocated or the photomask may be realigned to expose the third unprotected area. In one embodiment, the third unprotected area corresponds to the second portion 635 of the output coupling region 106. At operation 511, a third plurality of angled gratings 632 with third depths 629 is formed by directional RIE at the predetermined angle for a third predetermined period of time. The third plurality of angled gratings 632 further includes top surfaces 606 and bottom surfaces 628 parallel to the surface 602 of the substrate 601 and sidewall surfaces 608 slanted by an amount relative to the surface 602 of the substrate 601.

At operation 512, the top pattern surfaces 607, the waveguide pattern 633, and the hard mask 603 disposed under the top pattern surfaces 607 and the waveguide pattern 633 are removed by plasma ashing. At operation 513, the hard mask 603 disposed under the top pattern surfaces 607 and waveguide pattern 633 is removed by ion etching, RIE, or highly selective wet chemical etching to form the waveguide structure 600 having the input coupling region 102, the waveguide region 104, and the output coupling region 106. In another embodiment, the hard mask 603 is not removed and the hard mask 603 comprises materials with controlled refractive indices between about 1.5 and about 2.5. The waveguide structure 600 resulting from the method 500 has substantially uniform refractive index.

In summation, methods for fabricating waveguide structures utilizing substrates are described herein. The utilization of substrates provide for waveguide structures having input coupling regions, waveguide regions, and output coupling regions with substantially uniform refractive indices. Utilizing materials having a refractive index of between about 1.5 and about 2.5 for the substrates, as compared to the refractive index of air (1.0), total internal reflection, or at least a high degree thereof, is achieved to facilitate light propagation through the augmented structure.

While the foregoing is directed to examples of the present disclosure, other and further examples of the disclosure may be devised without departing from the basic scope thereof, and the scope thereof is determined by the claims that follow.

What is claimed is:

1. A method for forming a waveguide structure comprising:
    imprinting a stamp into a resist to form a positive waveguide pattern, the resist is disposed on a hard mask formed on a surface of a portion of a substrate, the positive waveguide pattern comprises a pattern including at least one of a first plurality of grating patterns, a waveguide pattern, and a second plurality of grating patterns, each of the first plurality of grating patterns and the second plurality of grating patterns have a residual layer and top pattern surfaces;
    performing a curing process to cure the positive waveguide pattern;
    releasing the stamp;
    performing a first etching process to remove the residual layer and the hard mask disposed under the residual layer and to expose the surface of the substrate;
    masking the substrate to expose a first unprotected area of the surface of the substrate;
    performing a second etching process for a first period of time to form a first plurality of gratings with first depths;
    masking the substrate to expose a second unprotected area of the surface of the substrate;
    performing the second etching process for a second period of time to form a second plurality of gratings with second depths are different than that of the first depths; and
    removing the top pattern surfaces, the waveguide pattern, and the hard mask disposed under the top pattern surfaces and the waveguide pattern to form a waveguide structure comprising at least one of an input coupling region, a waveguide region, and an output coupling region.

2. The method of claim 1, wherein the top pattern surfaces and the residual layer are parallel to the surface of the substrate.

3. The method of claim 1, wherein the first plurality of grating patterns and the second plurality of grating patterns further comprise sidewall pattern surfaces oriented normal to the surface of the substrate.

4. The method of claim 1, wherein the first plurality of grating patterns and the second plurality of grating patterns further comprise sidewall pattern surfaces slanted by an amount relative to the surface of the substrate.

5. The method of claim 1, wherein the first etching process comprises:
    plasma ashing using at least one of an oxygen gas ($O_2$) containing plasma, a fluorine gas ($F_2$) containing plasma, a chlorine gas ($Cl_2$) containing plasma and a methane ($CH_4$) containing plasma until the residual layer is removed; and
    ion etching, reactive ion etching (RIE), or highly selective wet chemical etching the hard mask disposed under the residual layer.

6. The method of claim 1, wherein the second etching process comprises angled ion etching.

7. The method of claim 6, wherein the resist is deposited of the surface of the portion of the substrate by a liquid material pour casting process, a spin-on coating process, a liquid spray coating process, a dry powder coating process, a screen printing process, a doctor blading process, a physical vapor deposition (PVD) process, a chemical vapor deposition (CVD) process, a flowable CVD (FCVD) process, or an atomic layer deposition (ALD) process.

8. A method for forming a waveguide structure comprising:
    imprinting a stamp into a resist to form a positive waveguide pattern, the resist is disposed on a hard mask formed on a surface of a portion of a substrate, the positive waveguide pattern comprises a pattern including at least one of a first plurality of grating patterns, a waveguide pattern, and a second plurality of grating patterns, each of the first plurality of grating patterns and the second plurality of grating patterns have a residual layer, top pattern surfaces, and sidewall pattern surfaces slanted relative to the surface of the substrate;
    performing a curing process to cure the positive waveguide pattern;
    releasing the stamp;
    performing a first etching process to remove the residual layer and the hard mask disposed under the residual layer and to expose the surface of the substrate;
    masking the substrate to expose a first unprotected area of the surface of the substrate;
    etching at an angle for a first period of time to form a first plurality of angled gratings with first depths;
    masking the substrate to expose a second unprotected area of the surface of the substrate;
    etching at the angle for a second period of time to form a second plurality of angled gratings with second depths are different than that of the first depths; and
    removing the top pattern surfaces, the waveguide pattern, and the hard mask disposed under the top pattern surfaces and the waveguide pattern to form a waveguide structure comprising at least one of an input coupling region, a waveguide region, and an output coupling region.

9. The method of claim 8, further comprising:
    masking the substrate to expose a third unprotected area of the surface of the substrate; and
    etching at the angle for a third period of time to form a third plurality of angled gratings with third depths.

10. The method of claim 9, wherein each of the first plurality of angled gratings with the first depths, second plurality of angled gratings with the second depths, and third plurality of angled gratings with the third depths include:
    top surfaces parallel to the surface of the substrate;
    sidewall surfaces slanted by an amount relative to the surface of the substrate; and
    bottom surfaces corresponding to the surface of the substrate.

11. The method of claim 10, wherein etching at the angle comprises directional reactive ion etching (RIE).

12. The method of claim 8, wherein the first etching process comprises:

plasma ashing using at least one of an oxygen gas ($O_2$) containing plasma, a fluorine gas ($F_2$) containing plasma, a chlorine gas ($Cl_2$) containing plasma and a methane ($CH_4$) containing plasma until the residual layer is removed; and ion etching, reactive ion etching (RIE), or highly selective wet chemical etching the hard mask disposed under the residual layer.

13. The method of claim 8, wherein the curing process comprises ultraviolet (UV) curing, infrared (IR) curing, solvent evaporation curing, or thermal curing.

14. The method of claim 8, wherein the resist is deposited of the surface of the portion of the substrate by a liquid material pour casting process, a spin-on coating process, a liquid spray coating process, a dry powder coating process, a screen printing process, a doctor blading process, a physical vapor deposition (PVD) process, a chemical vapor deposition (CVD) process, a flowable CVD (FCVD) process, or an atomic layer deposition (ALD) process.

15. A method for forming a waveguide structure comprising:

imprinting a stamp into a resist to form a positive waveguide pattern, the resist is disposed on a hard mask formed on a surface of a substrate, the positive waveguide pattern comprises a pattern including at least one of a first plurality of grating patterns, a waveguide pattern, and a second plurality of grating patterns, each of the first plurality of grating patterns and the second plurality of grating patterns have a residual layer, top pattern surfaces, and sidewall pattern surfaces slanted by relative to the surface of the substrate;

electromagnetic radiation curing the positive waveguide pattern;

releasing the stamp;

plasma ashing until the residual layer is removed;

reactive ion etching the hard mask disposed under the residual layer to expose the surface of the substrate;

masking the substrate to expose a first unprotected area of the surface of the substrate;

directional reactive ion etching (RIE) at an angle for a first period of time to form a first plurality of angled gratings with first depths;

masking the substrate to expose a second unprotected area of the surface of the substrate;

directional RIE at the angle for a second period of time to form a second plurality of angled gratings with second depths are different than that of the first depths;

masking the substrate to expose a third unprotected area of the surface of the substrate;

directional RIE at the angle for a third period of time to form a third plurality of angled gratings with third depths;

plasma ashing until the top pattern surfaces and the waveguide pattern are removed; and reactive ion etching the hard mask disposed under the top pattern surfaces and the waveguide pattern to form waveguide structure comprising at least one of an input coupling region, a waveguide region, and an output coupling region.

16. The method of claim 15, wherein the top pattern surfaces are parallel to the surface of the substrate.

17. The method of claim 15, wherein the plasma ashing further comprises using at least one of an oxygen gas ($O_2$) containing plasma, a flouring gas ($F_2$) containing plasma, a chlorine gas ($Cl_2$) containing plasma and a methane ($CH_4$) containing plasma until the residual layer is removed.

18. The method of claim 15, wherein the resist is deposited of the surface of the substrate by a liquid material pour casting process, a spin-on coating process, a liquid spray coating process, a dry powder coating process, a screen printing process, a doctor blading process, a physical vapor deposition (PVD) process, a chemical vapor deposition (CVD) process, a flowable CVD (FCVD) process, or an atomic layer deposition (ALD) process.

19. The method of claim 15, wherein each of the first plurality of angled gratings with the first depths, second plurality of angled gratings with the second depths, and third plurality of angled gratings with the third depths further comprise:

top surfaces parallel to the surface of the substrate;

sidewall surfaces slanted by an amount relative to the surface of the substrate; and bottom surfaces corresponding to the surface of the substrate.

20. The method of claim 15, wherein masking the substrate comprises placing a shadow mask in physical contact with the surface of the substrate or aligning a photomask over the substrate to expose the first unprotected area, the second unprotected area, or the third unprotected area.

* * * * *